(12) United States Patent
Sato (10) Patent No.: US 7,633,250 B2
(45) Date of Patent: Dec. 15, 2009

(54) FAN

(75) Inventor: Yoichi Sato, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 843 days.

(21) Appl. No.: 10/995,189

(22) Filed: Nov. 24, 2004

(65) Prior Publication Data

US 2006/0001391 A1    Jan. 5, 2006

(30) Foreign Application Priority Data

Jun. 30, 2004    (JP) .............................. 2004-193574

(51) Int. Cl.
*H02P 3/00* (2006.01)
*H02P 5/00* (2006.01)
*H02P 7/00* (2006.01)
*H02P 3/20* (2006.01)

(52) U.S. Cl. ................... 318/268; 318/278; 318/400.3; 388/803

(58) Field of Classification Search ................. 388/803; 318/268, 278, 400.3
See application file for complete search history.

(56) References Cited

U.S. PATENT DOCUMENTS 5,166,585 A * 11/1992 Koharagi et al. ....... 318/400.08
5,682,826 A * 11/1997 Hollenbeck ................. 110/147

FOREIGN PATENT DOCUMENTS

JP    05-252784    9/1993
JP    05-264080    10/1993

* cited by examiner

*Primary Examiner*—Bentsu Ro
*Assistant Examiner*—Erick Glass
(74) *Attorney, Agent, or Firm*—Fujitsu Patent Center (57) ABSTRACT

The present invention provides a fan that has a fan motor and two signal lines including a number-of-rotations switching control signal line and a rotational state outputting signal line, makes the fan motor rotate at a number of rotations determined by a number-of-rotations switching control signal input via the number-of-rotations switching control signal line, outputs the rotational state of the fan motor via the rotational state outputting signal line, and can provide notification of detail data without increasing the number of signal lines. The fan retains data in the data storage section in a non-volatile manner and outputs the data via the conventionally existing rotational state outputting signal line.

8 Claims, 11 Drawing Sheets

Signal waveform on signal line of conventional fan

Control signal waveform
(three instructions to shift from low-speed rotation to high-speed rotation)

→ Time

Signal waveform on signal line of fan according to this embodiment

Control signal waveform
(three instructions to shift from low-speed rotation to high-speed rotation)

→ Time

Signal waveform on signal line of conventional fan

Signal waveform on signal line of fan according to this embodiment

Fig. 11

FAN

BACKGROUND OF THE INVENTION

1. Field of the Invention

The present invention relates to a fan having a fan motor and two signal lines including a number-of-rotations switching control signal line and a rotational state outputting signal line, in which the fan motor runs at a number of rotations determined by a number-of-rotations switching control signal input via the number-of-rotations switching control signal line, and the fan outputs the rotational state of the fan motor via the rotational state outputting signal line.

2. Description of the Related Art

Various fans have been used for ventilation or air conditioning (see Japanese Patent Laid-Open No. 5-252784 and Japanese Patent Laid-Open No. 5-264080, for example).

For example, a server has many fans for cooling. To prevent a failure of a fan from leading to insufficient cooling of the system and interruption of the service, such a server has a redundant configuration including more fans than necessary or unitizes the fans to enable active replacement. Furthermore, there is a system that monitors and controls fans and, if a fan fails, immediately notifies the system manager of the failure to permit replacement of the failed fan. A larger server requires more fans, so that each fan has to be monitored and controlled more precisely.

Most fans used for cooling servers have a number-of-rotations switching control signal line and a rotational state outputting signal line.

Such a fan outputs the rotational state of the fan motor, and thus, the system can monitor the rotational state to know if the fan motor runs normally at that instant. However, conventional fans provide no detail data as to the manufacturers, the dates of manufacture, when the fans were put into service, or how long the fans have been in service. Therefore, there is a problem that preventive measures cannot be taken, for example, a fan cannot be replaced with a new one based on a prediction that the fan will stop rotating soon.

Besides, there has been devised a system that unitizes fans and can grasp the performance of the fans by reading additional information, such as a switch-based ID setting (for example, four kinds of outputs represented by two bits), that is set in the unit for differentiating the fans according to their performance. However, additional signal lines for reading the switch-based ID setting have to be provided in the unit, and if multiple IDs are set, the number of signal lines increases. For example, a large server has many fans, and each fan has the number-of-rotations switching control signal line and the rotational state outputting signal line. Thus, such a further increase of the number of signal lines is a problem.

Alternatively, rather than simply setting an ID in the fan unit, a memory for storing detail data regarding the fans may be provided in the fan unit. However, if signal lines are provided for reading the data from the memory, for the same reason as described above, there arises a problem that the total number of signal lines extremely increases.

SUMMARY OF THE INVENTION

The present invention has been made in view of the above circumstances and provides a fan that can provide notification of detail data without increasing signal lines.

The present invention provides a fan that has a fan motor and two signal lines including a number-of-rotations switching control signal line and a rotational state outputting signal line, in which the fan motor rotates at a number of rotations determined by a number-of-rotations switching control signal input via the number-of-rotations switching control signal line, and the fan outputs the rotational state of the fan motor via the rotational state outputting signal line, the fan including:

a data storage section that stores data in a non-volatile manner; and     a data output section that outputs the data stored in the data storage section via the rotational state outputting signal line.

The fan according to the present invention retains data in the data storage section in a non-volatile manner and outputs the data via the conventionally existing rotational state outputting signal line. Therefore, the fan can provide notification of detail data about the fan without increasing the number of signal lines.

In the fan according to the present invention, it is preferred that the data output section outputs data at a predetermined time when the number of rotations of the fan motor changes, for example, the data output section outputs data at a time when a power supply is turned on and the fan motor starts rotating. Alternatively, it is preferred that the data output section outputs data at a time when the fan motor decreases the number of rotations in response to a control signal that instructs the fan to decrease the number of rotations, the control signal being input via the number-of-rotations switching control signal line.

Since it is ineffective to monitor the signal indicating the rotational state of the fan motor output via the rotational state outputting signal line when the fan motor is changing the number of rotations, for example, immediately after the fan motor is activated or immediately after the fan motor is instructed to change the number of rotations, a system monitors the signal when the fan motor rotates stably. Thus, if the data is output at a time when the fan motor is changing the number of rotations, there is no need to change the timing of monitoring the rotational state of the fan motor or the like, and thus, a conventional system that does not have a capability of reading data and can only monitor the rotational state of the fan motor can be applied.

In addition, it is preferred that the fan according to the present invention further has a data write section that writes data transmitted via the rotational state outputting signal line to the data storage section.

By providing the fan with the data write section, data the manufacturer of the fan cannot write, such as date as to when the fan is put into service, the date for an overhaul, the result of the overhaul, can be retained for later reference. Besides, data is written to the data write section via the conventionally existing rotational state outputting signal line, and therefore, there is no need to add a new signal line.

For example, the data write section may write data at a time when power is being supplied and the rotation of the fan is forcibly stopped. Alternatively, the data write section may write data in response to a data write instruction signal being input via the number-of-rotations switching control signal line.

As described above, the fan according to the present invention can store detail data and provide notification thereof using a conventional number of signal lines.

BRIEF DESCRIPTION OF THE DRAWINGS

FIG. 7 is a timing chart for illustrating a case where the power supply is turned on;

DETAILED DESCRIPTION OF THE INVENTION

In the following, an embodiment of the present invention will be described.

Figure 1:
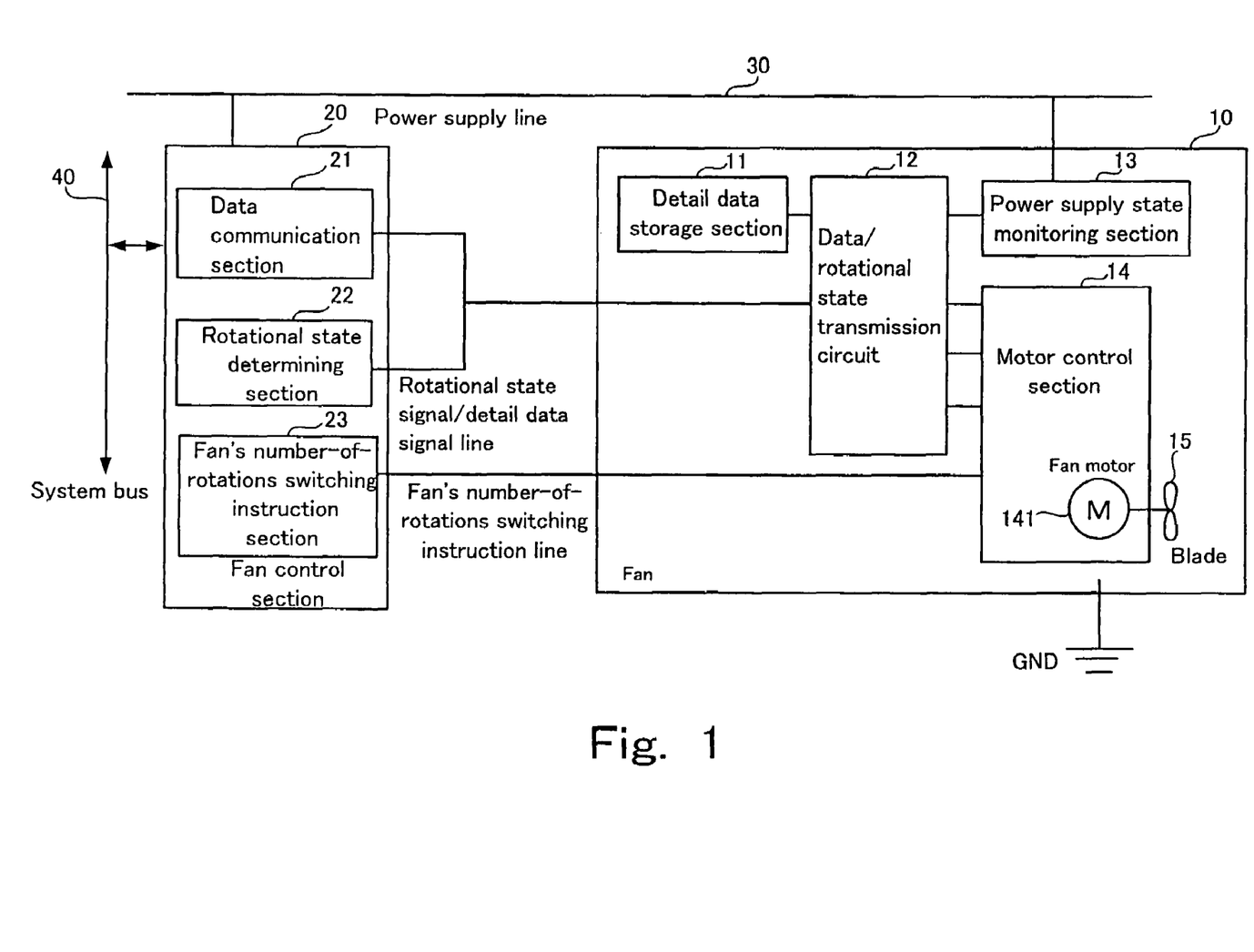
FIG. 1 shows an exemplary minimum configuration of a fan and a system that monitors and controls the fan.

FIG. 1 shows a minimum configuration of a fan and a system that monitors and controls the fan.

FIG. 1 shows a fan 10, a fan control section 20, which is a system that monitors and controls the fan 10, a common power supply line 30 for the fan and the fan control section 20, and a system bus 40 that connects the fan control section 20 to a host system of the fan control section 20.

The fan 10 has a detail data storage section 11, a data/rotational state transmission circuit 12, a power supply state monitoring section 13, a motor control section 14 including a fan motor 141, and a blade 15.

The detail data storage section 11 is a recordable non-volatile memory and stores detail data about the fan 10 in a non-volatile and recordable manner.

The power supply state monitoring section 13 monitors the state of the power supply line 30 and transmits a PWR-ON signal to the data/rotational state transmission circuit 12 when power is supplied.

The detail data stored or additionally recorded in the detail data storage section 11 include the name of the manufacturer, the fan name, the model number, the outer dimensions, the maximum air capacity, the maximum static pressure, the rated values (of the current, the voltage and the power), the steady-state number of rotations, the noise, the life time, the manufacturing factory, the lot number, the price, the type of the bearing arrangement, the frame material, the number of blades, comments about the fan's individual information, and the number-of-rotations history.

When power is supplied and the fan motor 141 is rotating, the motor control section 14 transmits a FAN-PULSE signal to the data/rotational state transmission circuit 12. The FAN-PULSE signal is a pulse string signal at a rate depending on the number of rotations of the fan motor 141 (at a rate of two pulses per rotation, in this embodiment). The blade 15 rotates by a rotational driving force of the fan motor 141.

When the fan motor 141 is not rotating although power is supplied, the motor control section 14 transmits a LOCK signal, which indicates that the fan is not rotating, to the data/rotational state transmission circuit 12. Furthermore, if a fan's number-of-rotations switching instruction signal is input to the motor control section 14 from the fan control section 20 via a fan's number-of-rotations switching instruction line, the motor control section 14 changes the rotational speed of the fan motor in accordance with the signal and transmits a SPEED-CTL signal, which indicates the number of rotations currently designated, to the data/rotational state transmission circuit 12.

Based on the PWR-ON signal output from the power supply state monitoring section 13 and the SPEED-CTL signal, the FAN-PULSE signal and the LOCK signal output from the motor control section 14, the data/rotational state transmission circuit 12 can determine whether to transmit the detail data stored in the detail data storage section 11 via a rotational state signal/detail data signal line, to transmit a signal indicating the rotational state of the fan motor via the rotational state signal/detail data signal line or to write detail data input via the rotational state signal/detail data signal line to the detail data storage section 11.

The data/rotational state transmission circuit 12 will be described in detail later.

The rotational state signal/detail data signal line is used in a switchable manner for transmission of the FAN-PULSE signal and the like from the fan 10 to the fan control section 20 and for transmission of detail data between the fan 10 and the fan control section 20, that is, transmission of bidirectional serial signals between the fan 10 and the fan control section 20. In this embodiment, the start-stop-synchronized bidirectional communication (that is, the half-duplex communication) is used for the transmission of bidirectional serial signals.

In addition, in this embodiment, the protocol for the bidirectional serial signals transmitted between the fan 10 and the fan control section 20 is previously specified separately.

Figure 2:
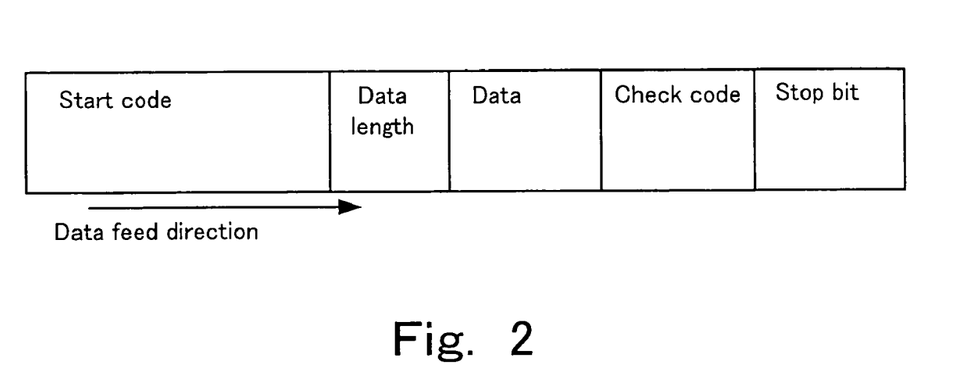
FIG. 2 shows a configuration of a set of data (a data packet) transmitted between the fan and a fan control section at a time according to an embodiment of the present invention.

FIG. 2 shows a configuration of a set of data (a data packet) transmitted between the fan 10 and the fan control section 20 at a time according to this embodiment.

As shown in FIG. 2, the data packet is composed of a start code (a code that identifies the beginning of data appearing when power supply to the fan is started, when a change of the number of rotations of the fan motor is instructed, and immediately after a data write request signal is transmitted), a data length, data (fan information), a check code (checksum, BCC, CRC or the like), and a stop bit.

The fan control section 20 has a data communication section 21, a rotational state determining section 22 and a fan's number-of-rotations switching instruction section 23. The data communication section 21 receives detail data transmitted from the fan 10 via the rotational state signal/detail data signal line and, in writing detail data to the fan 10, serves to transmit the detail data to the fan 10. The rotational state determining section 22 receives a signal indicating the rotational state of the fan motor (that is, a FAN-PULSE signal) transmitted from the fan 10 via the rotational state signal/detail data signal line and determines the rotational state of the fan motor. The fan's number-of-rotations switching instruction section 23 transmits a fan's number-of-rotations switching instruction signal via the fan's number-of-rotations switching instruction line. Furthermore, the fan's number-of-rotations switching instruction section 23 serves also to notify the fan 10 of a detail data write timing by successively outputting a predetermined number of (three, in this example) signals for increasing or decreasing the number of rotations of the fan. Data to be written to the fan 10 is transmitted from the host system to the fan control section 20 via the system bus 40, and then, the data communication section 21 transmits the detail data to the fan 10 via the rotational state signal/detail data signal line. On the other hand, detail data read from the detail data storage section 11 of the fan 10 and transmitted via the rotational state signal/detail data signal line is received at the data communication section 21 of the fan control section 20 and then transmitted to the host system from the fan control section 20 via the system bus 40.

The fan control section 20 will be described in detail later.

Figure 3:
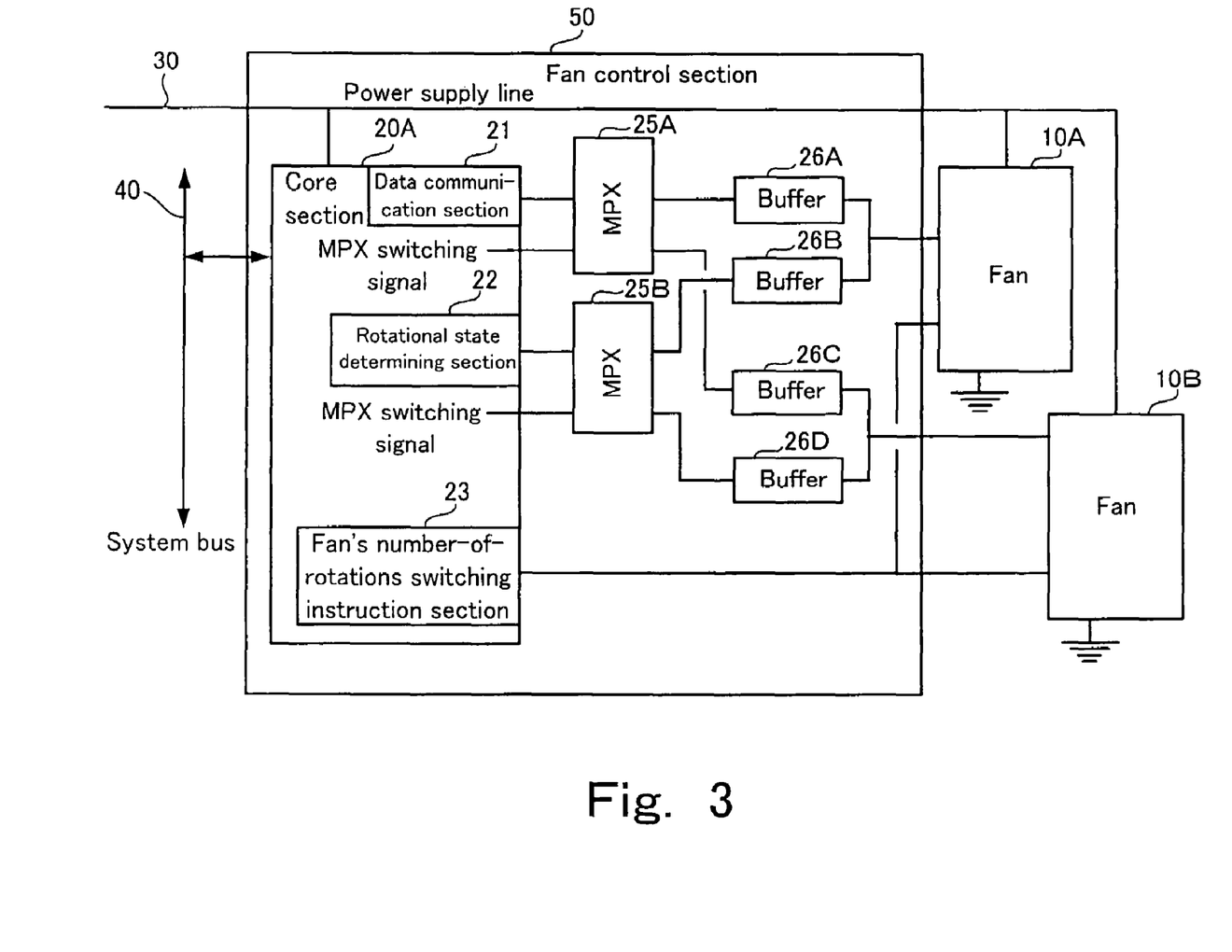
FIG. 3 shows an exemplary system configuration in which one control system controls plural fans.

FIG. 3 shows an example of system configuration in which one control system controls plural fans. Differences between this system and the system shown in FIG. 1 will be described.

FIG. 3 shows plural (two, in this example) fans 10A and 10B. The fans 10A and 10B are configured the same as the fan 10 shown in FIG. 1.

In addition, FIG. 3 shows a fan control section 50 that monitors and controls the plural fans 10A and 10B. The fan control section 50 has a core section 20A, which corresponds to the fan control section 20 in FIG. 1, multiplexers 25A and 25B, and buffers 26A, 26B, 26C and 26D. Besides performing the same function as the fan control section 20 in FIG. 1, the core section 20A outputs an MPX switching signal for switching the multiplexers 25A and 25B.

Power supply to the two fans 10A and 10B is started simultaneously, and the fan's number-of-rotations switching instruction signals transmitted from the fan's number-of-rotations switching instruction section 23 arrive at the plural fans 10A and 10B simultaneously.

On the other hand, signals indicating the states of the two fans 10A and 10B and detail data about the fans 10A and 10B are output independently from the respective fans 10A and 10B.

Thus, the system shown in FIG. 3 has the buffers 26A, 26B, 26C and 26D. The detail data transmitted from the two fans 10A and 10B are temporarily stored in the buffers 26A and 26C, respectively, and the core section 20A switches the multiplexer 25A to put the detail data from the buffers 26A and 26B into the data communication section 21 sequentially. Similarly, the fan-state indicating signals (FAN-PULSE signals) transmitted from the fans 10A and 10B are temporarily stored in the buffers 26B and 26D, respectively, and the core section 20A switches the multiplexer 25B to put the fan-state indicating signals from the buffers 26B and 26D into the rotational-state determining section 22 sequentially. The rotational-state determining section 22 sequentially determines the states of the fans 10A and 10B.

When the core section 20 transmits data to the fans 10A and 10B, the data destined for the fans 10A and 10B are not transmitted directly to the fans 10A and 10B but transmitted to the buffers 26A and 26C, respectively, by switching of the multiplexer 25A. The data are temporarily stored in the buffers 26A and 26C, respectively, and then transmitted from the buffers 26A and 26C to the fans 10A and 10B, respectively, at times for the fans 10A and 10B to receive the data.

With such a configuration, one fan control section 50 can monitor and control the plural fans 10A and 10B.

Now, referring to FIG. 1 again, the configuration shown in FIG. 1 will be described in detail.

Figure 4:
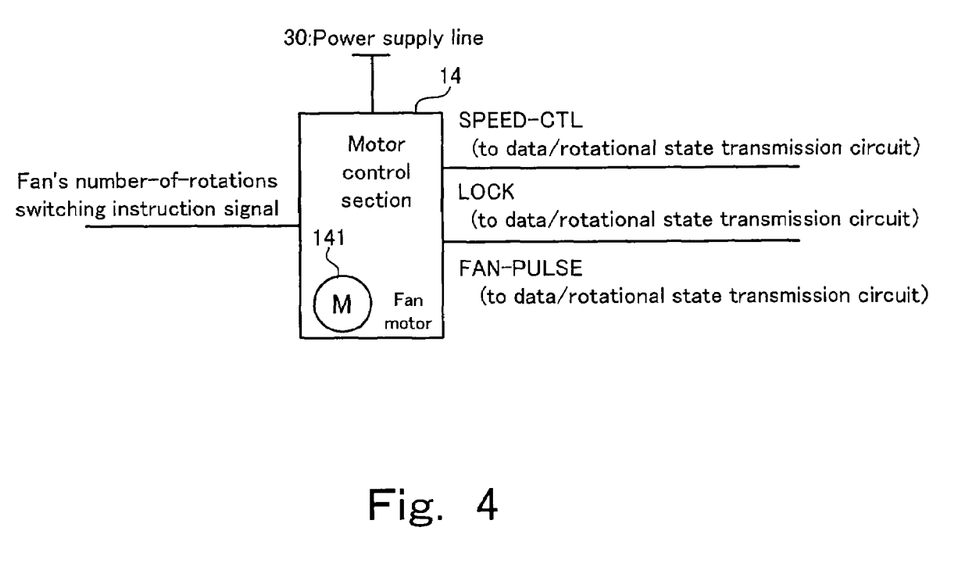
FIG. 4 shows signals input to or output from a motor control section of the fan shown in FIG. 1.

FIG. 4 shows signals input to or output from the motor control section 14 of the fan 10 shown in FIG. 1.

The motor control section 14 receives a fan's number-of-rotations switching instruction signal from the fan control section 20 (see FIG. 1) and transmits a SPEED-CTL signal, a LOCK signal and a FAN-PULSE signal to the data/rotational state transmission circuit 12 in the fan 10.

The motor control section 14 increases or decreases the number of rotations of the fan motor 141 in accordance with the fan's number-of-rotations switching instruction signal. The fan motor 141 is connected to the blade 15 (see FIG. 1), and thus, if the fan motor 141 rotates at a high speed or low speed, the blade 15 also rotates at a high speed or low speed.

When the fan motor 141 rotates normally, the motor control section 14 outputs the SPEED-CTL signal indicating whether the fan motor 141 currently rotates at the low speed or high speed and generates and outputs the FAN-PULSE signal, which is a pulse string signal containing two pulses per rotation.

If the rotation of the fan motor 141 is stopped by a physical force, for example, the rotating blade is stopped by a hand of an operator, the LOCK signal that indicates that the fan motor 141 is stopped by a physical force is output.

Figure 5:
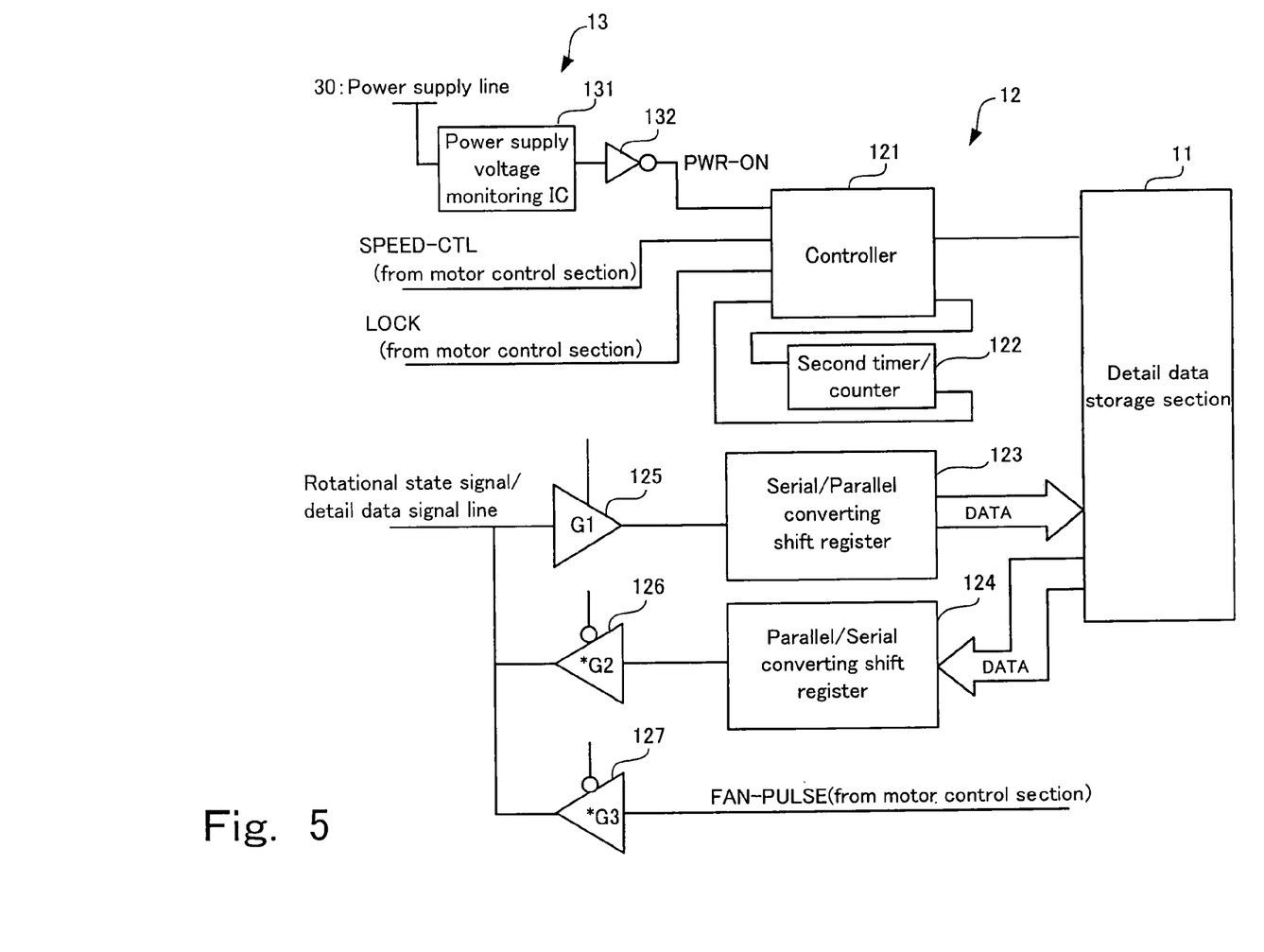
FIG. 5 shows a detail data storage section, a data/rotational state transmission circuit, and a power supply state monitoring section of the fan shown in FIG. 1.

FIG. 5 shows the detail data storage section 11, the data/rotational state transmission circuit 12, and the power supply state monitoring section 13 of the fan 10 shown in FIG. 1. FIG. 5 primarily shows details of the data/rotational state transmission circuit 12.

Referring to FIG. 5, the power supply state monitoring section 13 shown in FIG. 1 is composed of a power supply voltage monitoring IC 131 and an inverter 132. The power supply state monitoring section 13 monitors the voltage of the power supply line 30 and transmits the PWR-ON signal to a controller 121 of the data/rotational state transmission circuit 12 via the inverter 132 if a predetermined or higher voltage is input via the power supply line 30.

Referring to FIG. 5, the data/rotational state transmission circuit 12 shown in FIG. 1 is composed of the controller 121, a second timer/counter 122, a serial/parallel converting shift register 123, a parallel/serial converting shift register 124 and three gates 125, 126 and 127.

Depending on the control signals input to the gates 125, 126 and 127, the gates 125, 126 and 127 are opened to output the input signals just as they are or closed to separate the input thereof from the output thereof.

When the controller 121 of the data/rotational state transmission circuit 12 receives the PWR-ON signal from the power supply state monitoring section 13, the controller 121 opens the gate 126 and performs a read control of the detail data storage section 11 for reading the detail data from the detail data storage section 11. The detail data read from the detail data storage section 11 is converted into a serial signal in the parallel/serial converting shift register 124, and the serial signal is transmitted to the rotational state signal/detail data signal line via the gate 126. The serial signal representing the detail data is received by the data communication section 21 of the fan control section 20 shown in FIG. 1. At the same time as opening the gate 126, the controller 121 sets the second timer/counter 122 for a time enough to complete the transmission of the serial signal and activates the second timer/counter 122. When the set time has elapsed, the second timer/counter 122 transmits a count-up signal to the controller 121. The controller 121, upon receiving the count-up signal, closes the gate 126 and opens the gate 127. Then, the FAN-PULSE signal transmitted from the motor control section 14 shown in FIG. 1 is transmitted to the fan control section 20 (see FIG. 1) via the gate 127 and the rotational state signal/detail data signal line.

If the fan's number-of-rotations switching signal (SPEED-CTL signal) transmitted from the motor control section 14 is switched from high-speed rotation instruction to low-speed rotation instruction in a state where the PWR-ON signal is continuously input, the controller 121 opens the gate 126 and performs a read control of the detail data storage section 11 so that the data stored in the detail data storage section 11 is transmitted to the rotational state signal/detail data signal line via the gate 126. The detail data read from the detail data storage section 11 is converted into a serial signal in the parallel/serial converting shift register 124, and the serial signal is transmitted to the rotational state signal/detail data signal line via the gate 126 and received by the data communication section 21 of the fan control section 20 shown in FIG. 1. At the same time as opening the gate 126, the controller 121 sets the second timer/counter 122 for a time enough to complete the transmission of the serial signal and activates the second timer/counter 122. When the set time has elapsed, the second timer/counter 122 transmits a count-up signal to the controller 121. The controller 121, upon receiving the count-up signal, closes the gate 126 and opens the gate 127. Then, the FAN-PULSE signal transmitted from the motor control section 14 shown in FIG. 1 is transmitted to the fan control section 20 (see FIG. 1) via the gate 127 and the rotational state signal/detail data signal line.

Figure 9:
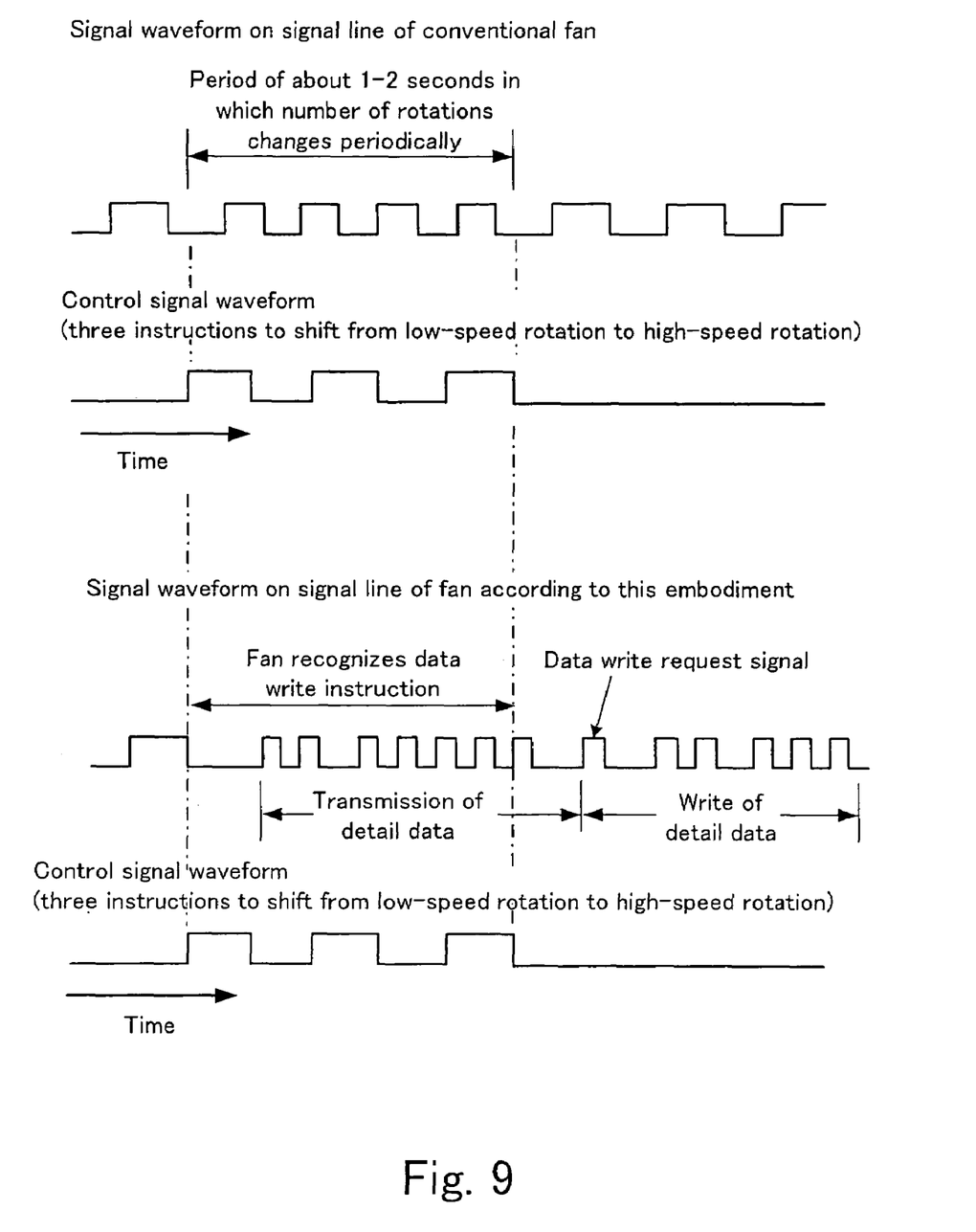
FIG. 9 is a timing chart for illustrating a case where a control signal that instructs data write is transmitted from the fan control section to the fan.

If the fan's number-of-rotations switching signal (SPEED-CTL signal) is repeatedly switched from low-speed rotation instruction to high-speed rotation instruction plural (three, in this example) times within a predetermined time in a state where the PWR-ON signal is continuously input, the controller 121 enters a data write mode for writing data to the detail data storage section 11 and transmits a data write request signal to the rotational state signal/detail data signal line at a predetermined timing shown in the timing chart of FIG. 9 described later. The data write request signal is transmitted as described below.

The detail data storage section 11 stores not only the detail data concerning the fan but also control data, which corresponds to the data write request signal. If the SPEED-CTL signal from the fan control section 20 is switched from low-speed rotation instruction to high-speed rotation instruction a predetermined number of (three, in this example) times within a predetermined time, and it is recognized that the controller 121 is in the data write mode, the control data is read from the detail data storage section 11 at a predetermined timing shown in FIG. 9 and converted into a serial data write request signal in the parallel/serial converting shift register 124, and the data write request signal is transmitted to the rotational state signal/detail data signal line via the gate 126.

Once the data write request signal is transmitted in this way, the gate 126 is closed, and the gate 125 is opened.

The second timer/counter 122 can perform a timer function and a counter function in parallel. When the SPEED-CTL signal is switched from low-speed rotation instruction to high-speed rotation instruction for the first time, the controller 121 sets the second timer/counter 122 for a predetermined time for determining whether the instruction switching is repeated or not, and counts the number (three, for example) of times of switching from low-speed rotation instruction to high-speed rotation instruction within the predetermined time using the second timer/counter 122. If the count value for the predetermined time exceeds a predetermined value (three, for example), it is recognized that the controller 121 is in the data write mode.

When the switching from low-speed rotation instruction to high-speed rotation instruction is repeated plural times, switching from high-speed rotation instruction to low-speed rotation instruction also occurs. Therefore, referring to the time chart described later, when the switching from high-speed rotation instruction to low-speed rotation instruction is made for the first time, a state where data is transmitted from the fan occurs. Thus, the data write is started by a write request signal transmitted after the data transmission from the fan is completed. Besides, although the fan's number-of-rotations switching signal (SPEED-CTL signal) is switched from high-speed rotation instruction to low-speed rotation instruction two more times while the fan is transmitting data, the fan does not retransmit the data.

When the gate 125 is opened, and the data is transmitted to the data/rotational state transmission circuit 12 from the fan control section 20 (see FIG. 1) via the rotational state signal/detail data signal line, the data, which is a serial signal, is converted into a parallel signal in the serial/parallel converting shift register 123 and written to the detail data storage section 11. At the time of starting the data write, the controller 121 sets the second timer/counter 122 for a time enough to surely complete the data write and activates the second timer/counter 122. When the set time has elapsed, the second timer/counter 122 generates a time-up signal. Upon receiving the time-up signal, the controller 121 closes the gate 125, opens the gate 127 for allowing the fan control section 20 to monitor the rotational state of the fan, and transmits the FAN-PULSE signal to the rotational state signal/detail data signal line.

Furthermore, the controller 121 also enters the data write mode when the controller 121 receives the LOCK signal from the motor control section 14 while it is continuously receiving the PWR-ON signal. In this case, the gate 125 is opened, and the data transmitted via the rotational state signal/detail data signal line is received at the serial/parallel converting shift register 123 through the gate 125, converted into a parallel signal therein and written to the detail data storage section 11. When the controller 121 receives the time-up signal indicating the completion of the data write from the second timer/counter 122, the controller 121 closes the gate 125, opens the gate 127, and transmits the FAN-PULSE signal from the motor control section 14 to the rotational state signal/detail data signal line.

Figure 6:
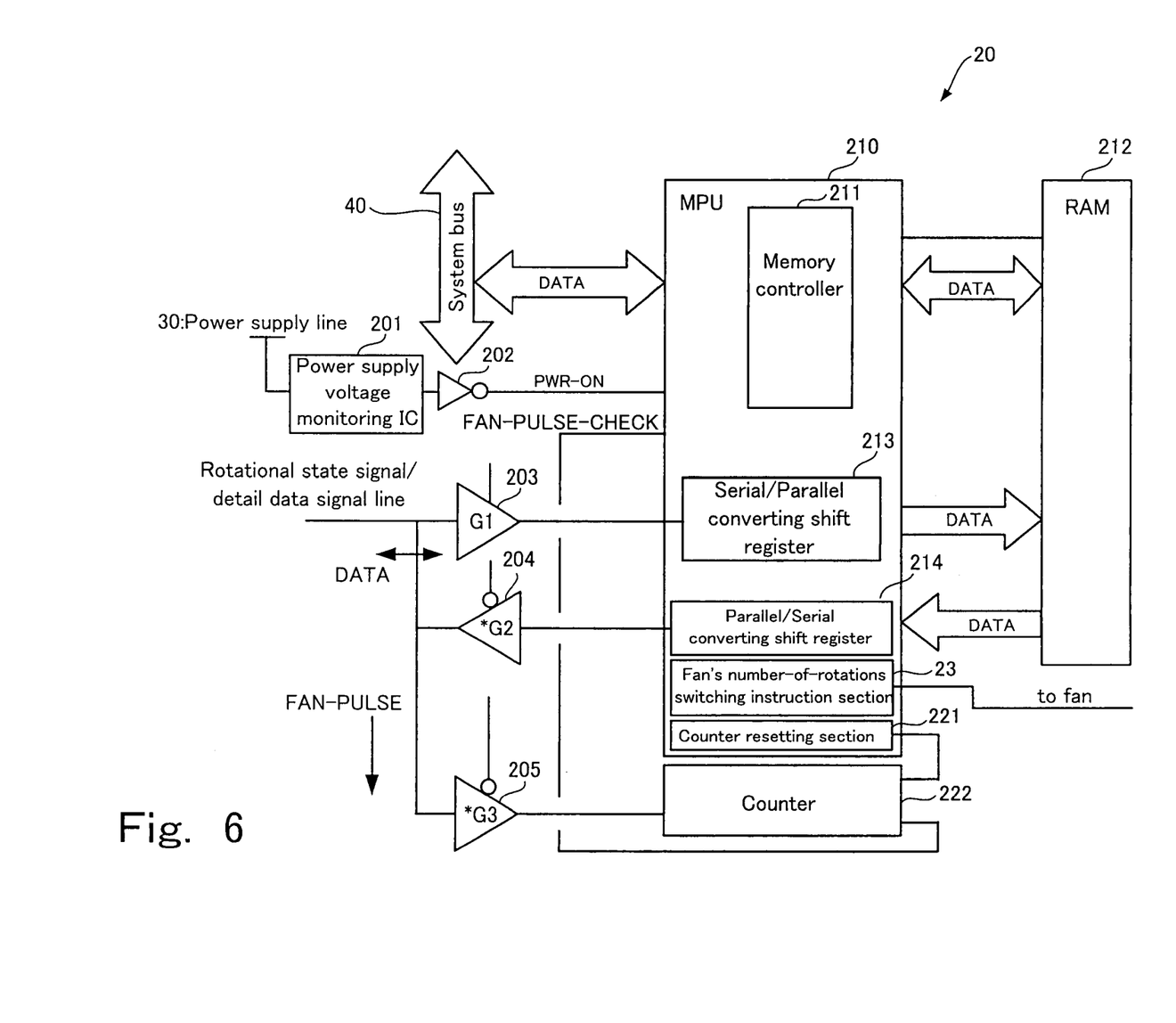
FIG. 6 is a detailed block diagram showing the fan control section shown in FIG. 1.

FIG. 6 is a detailed block diagram showing the fan control section 20 shown in FIG. 1.

Referring to FIG. 6, the fan control section 20 shown in FIG. 1 is composed of an MPU 210, an RAM 212, a power supply voltage monitoring IC 201, an inverter 202, a counter 222, and three gates 203, 204 and 205. Furthermore, the MPU 210 has a memory controller 211, a serial/parallel converting shift register 213, a parallel/serial converting shift register 214, a fan's number-of-rotations switching instruction section 23, and a counter resetting section 221. A composite of the memory controller 211, the RAM 212, the serial/parallel converting shift register 213 and the parallel/serial converting shift register 214 in the MPU 210 corresponds to the data communication section 21 shown in FIG. 1, and a composite of the counter resetting section 221 in the MPU 210, a counter 222 separate from the MPU 210 and a determination feature in the MPU 210 corresponds to the rotational state determining section 22 shown in FIG. 1.

The MPU 210 has a capability of determining the times to receive data from the fan, to transmit data to the fan (or write data to the fan) and to receive the FAN-PULSE signal based on the times when power supply to the fan 10 (see FIG. 1) is started and when a fan's number-of-rotations switching instruction is made, transmitting/receiving data or the like at the determined times, and notifying the host system of the data received from the fan (that is, the detail data and the rotational state of the fan) via the system bus 40. In addition, the fan control section 20 has a capability of receiving data to be written to the fan from the host system via the system bus 40.

The power supply voltage monitoring IC monitors the voltage of the power supply line 30 shared with the fan 10 (see FIG. 1) and transmits the PWR-ON signal to the MPU 210 via the inverter 202 if a predetermined or higher voltage is detected.

When the MPU 210 receives the PWR-ON signal, or the fan's number-of-rotations instruction transmitted from the fan's number-of-rotations switching instruction section 23 to the fan is changed from high-speed rotation instruction to low-speed rotation instruction, the MPU 210 opens the gate 203 for receiving the data from the fan.

When detail data is transmitted from the fan via the rotational state signal/detail data signal line, the MPU 210 receives the detail data via the gate 203, converts the data into parallel data in the serial/parallel converting shift register 213 and temporarily writes the parallel data to the RAM 212 under the control of the memory controller 211 that controls the access to the RAM 212. The data temporarily written to the RAM 212 is read from the RAM 212 under the control of the memory controller 211 and transmitted to the host system (not shown) via the system bus 40.

When reception of the data from the fan 10 (see FIG. 1) is completed, the gate 203 is closed, and the gate 205 is opened. A FAN-PULSE signal transmitted from the fan 10 via the rotational state signal/detail data signal line is fed to the counter 222 via the gate 205.

The counter 222 counts the pulses of the FAN-PULSE signal, and the MPU 210 periodically reads the count value from the counter 222 and checks if the count value reaches a prescribed pulse number, thereby determining whether the rotational state of the fan is adequate or not. The counter resetting section 221 resets the counter 222 each time the MPU 210 reads the count value from the counter 222.

When writing data to the fan 10, the data received from the host system via the system bus 40 is previously stored in the RAM 212 under the control of the memory controller 211.

When the fan 10 becomes capable of receiving data from the fan control section 20, the fan 10 transmits a data write request signal to the fan control section 20 via the rotational state signal/detail data signal line. Thus, the gate 203 is opened before the fan 10 transmits the data write request signal, and the MPU 210 receives the data write request signal via the gate 203, converts the signal into parallel data in the serial/parallel converting shift register 213, and determines whether the parallel data represents the write request signal or not. Data transmission from the fan control section 20 to the fan 10 is performed in two cases where data write to the fan 10 is requested from the fan's number-of-rotations switching instruction section 23 and where the blade 15 (see FIG. 1) is forcibly stopped rotating. In the case where data write to the fan 10 is requested from the fan's number-of-rotations switching instruction section 23, the MPU 210 knows the timing of the data write, and therefore, the MPU 210 closes the gate 205, opens the gate 203 and waits. On the other hand, the MPU 210 cannot know when the blade 15 is forcibly stopped. However, since who forcibly stops the blade 15 is the operator, the operator closes the gate 205 and opens the gate 203 manually before stopping the blade 15.

Once the MPU 210 recognizes a reception of a data write request signal, the MPU 210 closes the gate 203, opens the gate 204, reads the data from the RAM 212 under the control of the memory controller 211, converts the data into serial data in the parallel/serial converting shift register 214 and transmits the serial data to the fan 10 via the gate 204 and the rotational state signal/detail data signal line. Once the data transmission is completed, the gate 204 is closed, the gate 205 is opened, and the MPU 210 becomes ready to count the FAN-PULSE signals transmitted via the rotational state signal/detail data signal line using the counter 222.

According to the embodiment described herein, the fan is of a type that outputs a rotary pulse as the fan is rotating. However, if the fan is of a type that outputs a fan rotation stop signal directly indicating that the fan stops rotating, the counter 222 may be omitted.

Figure 7:
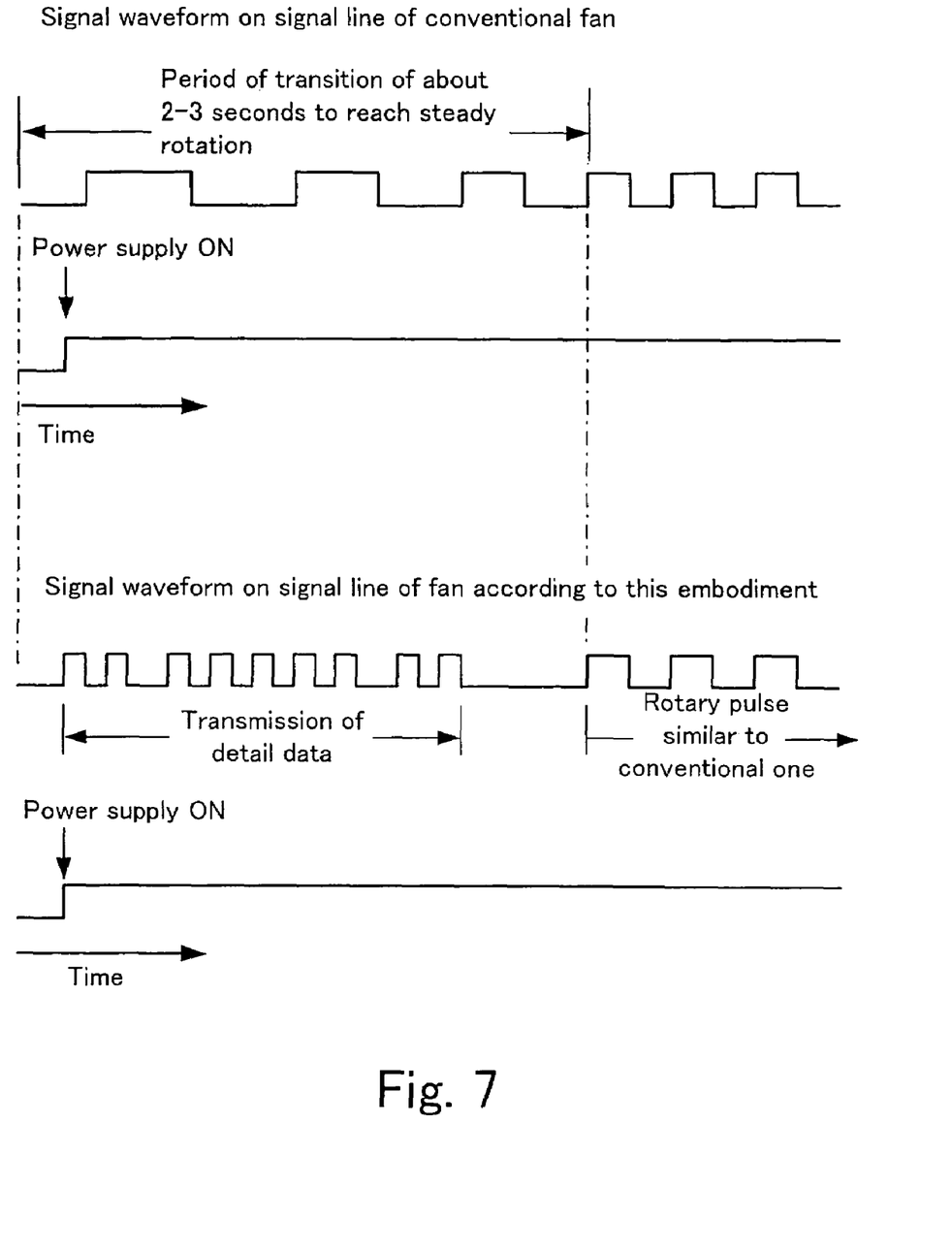

FIG. 7 is a timing chart for illustrating a case where the power supply is turned on. FIG. 7 shows a waveform of a signal on a signal line of a conventional fan and a waveform of a signal on a signal line of the fan according to this embodiment.

The relevant signal line of the fan according to this embodiment is the rotational state signal/detail data signal line shown in FIG. 1, and the relevant signal line of the conventional fan is a signal line corresponding to the rotational state signal/detail data signal line according to this embodiment. The same holds true for FIGS. 8 to 11 described later.

The fan starts rotating when the power supply is turned on, and the number of rotations gradually increases and reaches a steady number of rotations in two or three seconds. The conventional fan continuously outputs pulse signals (FAN-PULSE signals) on the signal line depending on the number of rotations without considering data read. On the other hand, according to this embodiment, the fan transmits detail data in response to turn-on of the power supply, and after the transmission is completed, the fan is switched to transmit FAN-PULSE signals as with the conventional fan.

Figure 8:
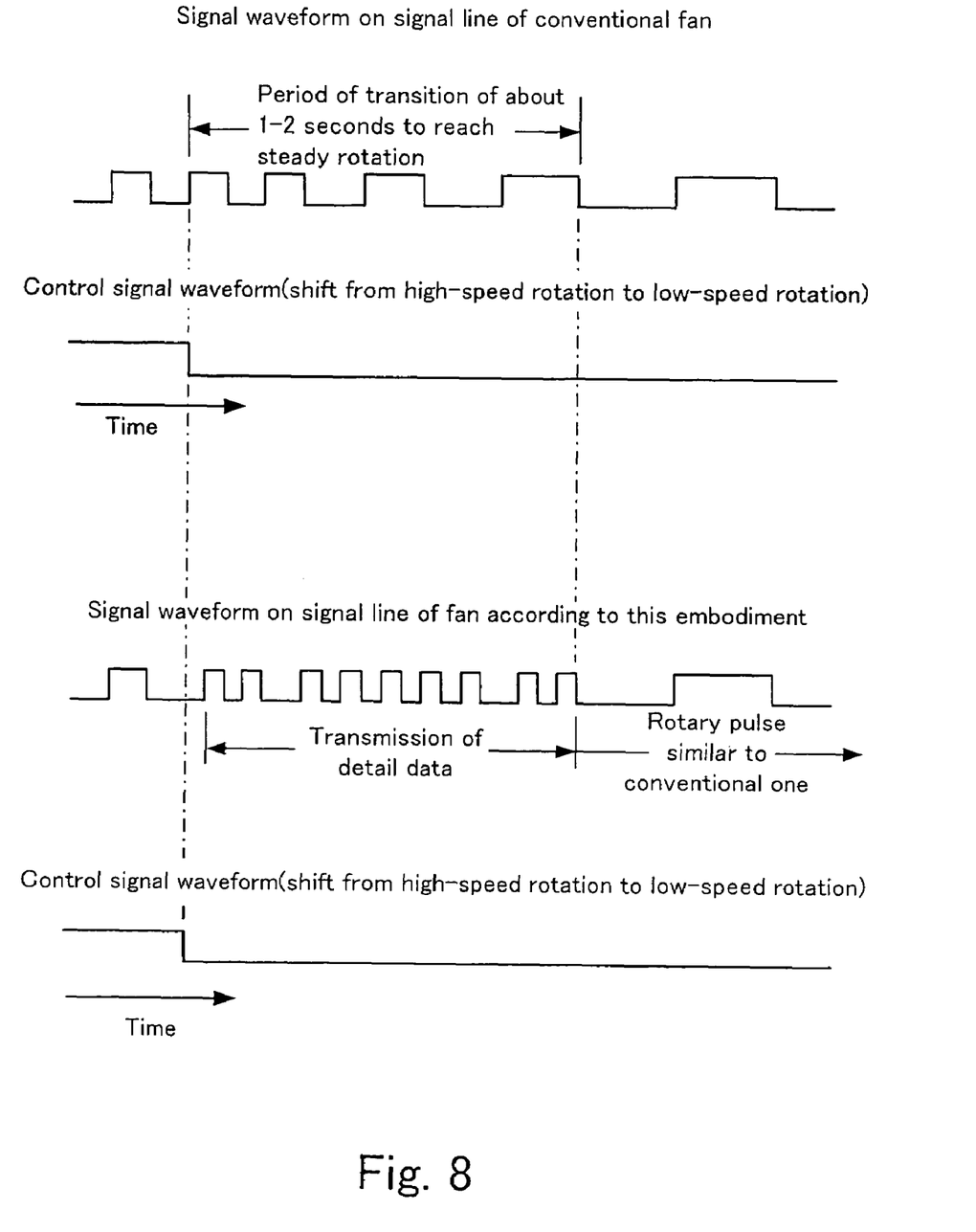
FIG. 8 is a timing chart for illustrating a shift from high-speed rotation to low-speed rotation.

FIG. 8 is a timing chart for illustrating a shift from high-speed rotation to low-speed rotation.

When an instruction to shift from high-speed rotation to low-speed rotation is provided, the fan shifts to a steady low-speed rotation state by gradually decreasing the number of rotations in one to two seconds. The conventional fan continuously outputs the FAN-PULSE signals during the period of gradual decrease of the number of rotations onto the signal line as they are, and the signals in the period of transition are neglected. On the other hand, according to this embodiment, when an instruction to shift from high-speed rotation to low-speed rotation is provided, the fan transmits detail data onto the signal line, and after the transmission of the detail data is completed, the fan starts transmitting the rotary pulse (FAN-PULSE signal) as with the conventional fan.

As described above, according to this embodiment, the period of transition in which the fan is changing the number of rotations, which has been neglected in the conventional fan, is used to transmit data from the fan.

FIG. 9 is a timing chart for illustrating a case where a control signal that instructs data write is transmitted from the fan control section 20 to the fan 10. Here, the control signal that instructs data write is composed of three successive instructions to shift from low-speed rotation to high-speed rotation.

The conventional fan only outputs a pulse signal indicating that the number of rotations periodically changes according to the control signal (that is, the instructions to change the number of rotations) onto the signal line. However, according to this embodiment, the control signal is recognized as a data write instruction, and the operations described below are performed. After the first instruction to shift from low-speed rotation to high-speed rotation is provided, when the next instruction to shift from high-speed rotation to low-speed rotation is provided, a discrimination between the data write instruction and the instruction to read data from the fan 10 described above with reference to FIG. 8 cannot be made, and the fan 10 continues to transmit the detail data onto the signal line. However, from the following change of the waveform of the control signal, the fan 10 recognizes that the control signal is a data write instruction, and transmits a data write request signal to the fan control section 20 following the transmission of the detail data. When the fan control section 20 receives the data write request, it transmits the detail data to be newly written to the fan 10 to the fan 10 via the signal line. While FIG. 9 shows no following sequence, once the write of the detail data is completed, the fan 10 transmits a rotary pulse signal (FAN-PULSE signal) onto the signal line.

Figure 10:
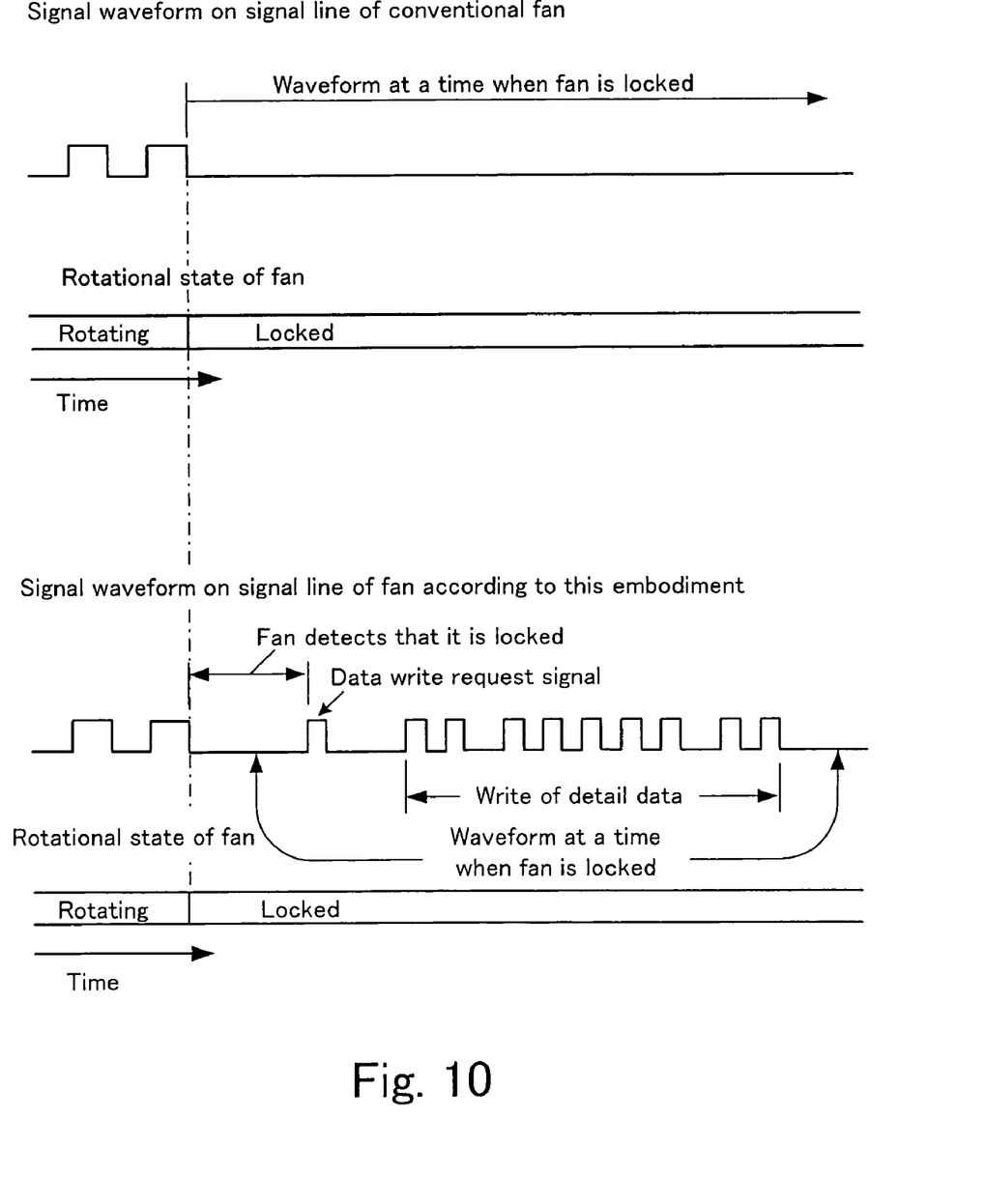
FIG. 10 is a timing chart for illustrating a case where the rotation of the fan is forcibly stopped.

FIG. 10 is a timing chart for illustrating a case where the rotation of the fan is forcibly stopped.

If the rotation of the fan motor is forcibly stopped, the conventional fan simply stops transmitting the rotary pulse. However, the fan according to this embodiment transmits a data write request signal onto the signal line in response to the fan motor being forcibly stopped, and when the fan control section receives the data write request signal, the fan control section transmits detail data to be newly written to the fan 10 onto the signal line.

Figure 11:
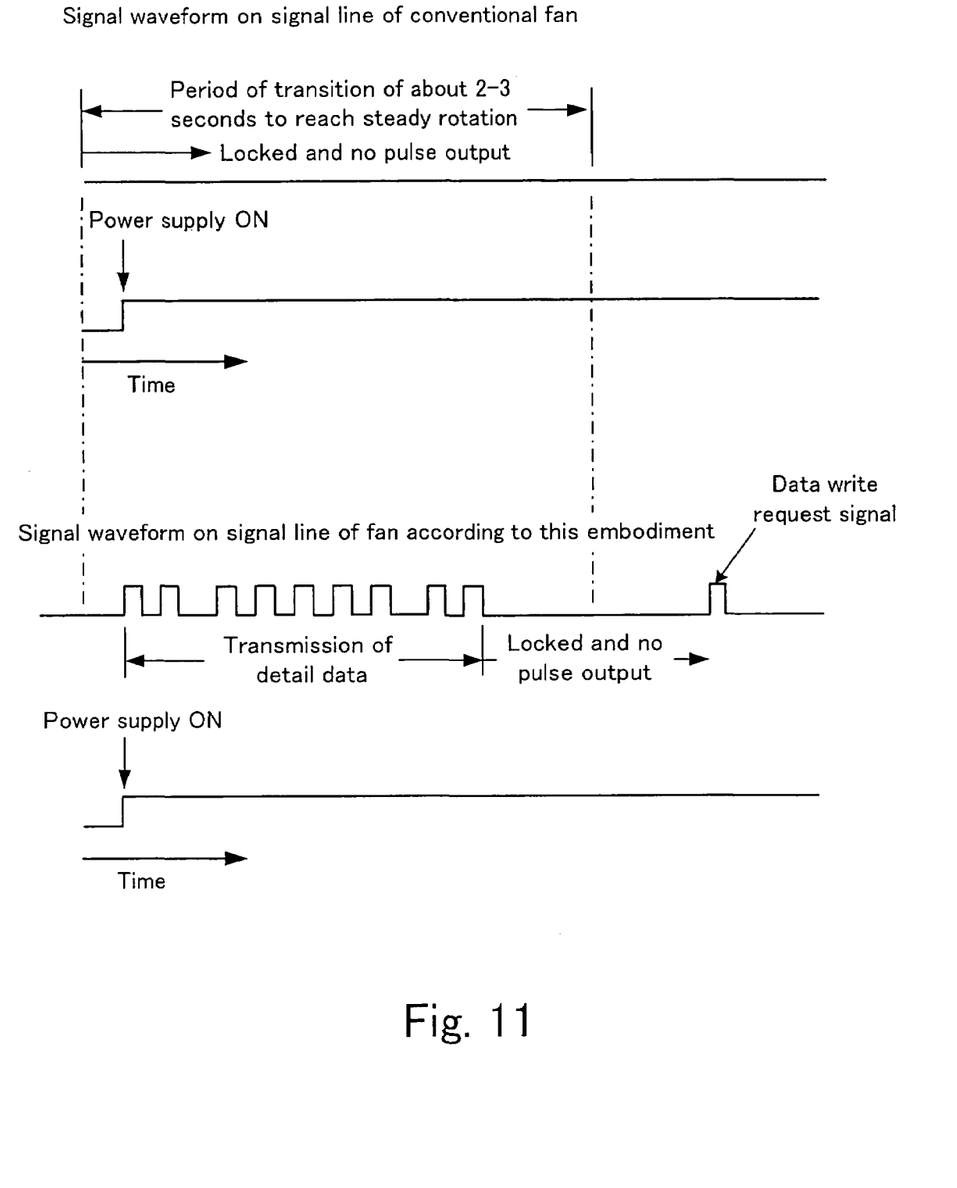
FIG. 11 is a timing chart for illustrating a case where the fan is forcibly locked not to start rotating when the power supply is off, and then the power supply is turned on with the fan remaining locked.

FIG. 11 is a timing chart for illustrating a case where the fan is forcibly locked not to start rotating when the power supply is off, and then the power supply is turned on with the fan remaining locked.

In response to the turn-on of the power supply, the fan first transmits detail data. Since the fan does not start rotating even after the detail data is transmitted, the controller 212 in the fan shown in FIG. 5 continues to receive the LOCK signal, and thus, the fan transmits a data write request signal onto the signal line. The operation following the transmission of the data write request is the same as that shown in FIG. 9 or 10.

What is claimed is:

1. A fan comprising:
    a fan blade;
    a fan motor to rotate the fan blade;
    a rotational state outputting signal line to transmit a rotational state of the fan motor and data about the fan;
    a motor control section to control the rotational speeds of the fan motor and to output a signal representing the rotational state of the fan motor;
    a power supply state monitoring section to monitor a power supply state of the fan and to output a signal representing the power supply state of the fan;
    a data storage section to store the data about the fan in a non-volatile manner; and
    a data output section to determine, based on the signal output from the power supply state monitoring section and the signal output from the motor control section, whether to transmit the data stored in the data storage section via the rotational state outputting signal line, to transmit the signal indicating the rotational state of the fan motor via the rotational state outputting signal line, or to write data input into the data output section via the rotational state outputting signal line to the data storage section.

2. The fan according to claim 1, wherein the data output section outputs the initial control data at a predetermined time when the number of rotations of the fan motor changes.

3. The fan according to claim 1, wherein the data output section outputs the initial control data at a time when a power supply is turned on and the fan starts rotating.

4. The fan according to claim 1, wherein the data output section outputs the initial control data at a time when the fan decreases the number of rotations in response to a control signal that instructs the fan to decrease the number of rotations, the control signal being input via the number-of-rotations switching control signal line.

5. The fan according to claim 1, further comprising a data write section that writes the initial control data transmitted via the rotational state outputting signal line to the data storage section.

6. The fan according to claim 5, wherein the data write section writes the initial control data at a time when power is being supplied and the rotation of the fan is forcibly stopped.

7. The fan according to claim 5, wherein the data write section writes the initial control data in response to a data write instruction signal being input via the number-of-rotations switching control signal line.

8. The fan according to claim 1, wherein the initial control data is any of the following: a maximum air capacity, a maximum static pressure, and a rated current value, a rated voltage value, a rated power value, a steady-state number of rotations, and a number-of-rotations.

* * * * *

UNITED STATES PATENT AND TRADEMARK OFFICE
CERTIFICATE OF CORRECTION

PATENT NO. : 7,633,250 B2  Page 1 of 1
APPLICATION NO. : 10/995189
DATED : December 15, 2009
INVENTOR(S) : Yoichi Sato It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1186 days.

Signed and Sealed this

Second Day of November, 2010

David J. Kappos
*Director of the United States Patent and Trademark Office*